United States Patent [19]

Kato

[11] Patent Number: 5,125,106
[45] Date of Patent: Jun. 23, 1992

[54] SWITCHING CONTROL APPARATUS FOR TUNING SYSTEM

[75] Inventor: Hiroshi Kato, Takatsuki, Japan

[73] Assignee: Matsushita Electric Industrial Co., Ltd., Osaka, Japan

[21] Appl. No.: 731,362

[22] Filed: Jul. 16, 1991

Related U.S. Application Data

[63] Continuation-in-part of Ser. No. 500,209, Mar. 28, 1990, abandoned.

[30] Foreign Application Priority Data

Mar. 31, 1989 [JP] Japan .................................. 1-83430

[51] Int. Cl.⁵ ............................................. H04B 1/16
[52] U.S. Cl. ............................. 455/182.1; 455/192.1; 455/343; 358/191.1
[58] Field of Search ............... 455/164, 182, 192, 260, 455/265, 343; 358/191.1, 195.1

[56] References Cited

U.S. PATENT DOCUMENTS

| | | | |
|---|---|---|---|
| 3,949,158 | 4/1976 | Rzeszewski et al. | |
| 4,375,651 | 3/1983 | Temolin et al. | |
| 4,601,060 | 7/1986 | Wine | 455/182 |
| 4,763,195 | 8/1988 | Tults | 455/182 |
| 4,814,887 | 3/1989 | Marz et al. | 455/182 |

FOREIGN PATENT DOCUMENTS 5123125 12/1970 Japan .
63-194407 1/1988 Japan .

*Primary Examiner*—Curtis Kuntz
*Attorney, Agent, or Firm*—Stevens, Davis, Miller & Mosher

[57] ABSTRACT

A switch control apparatus for a tuning system includes a station selecting unit which has an analog to digital converter to which a first signal indicative of the reception state of a receiver and a second information signal independent of the first signal are inputted. A switching circuit selects one of the two input signals to the analog to digital converter in accordance with the on or off state of a power supply of the receiver. A control circuit controls the switching circuit such that when the power supply is on, the first signal indicative of the reception state is inputted to the analog to digital converter while when the power source is off, the second information signal is input to the analog to converter.

1 Claim, 4 Drawing Sheets

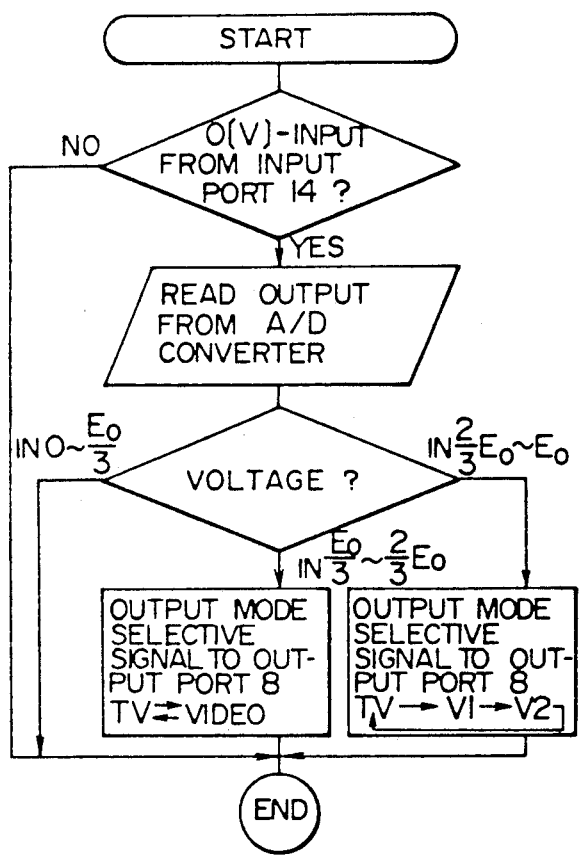
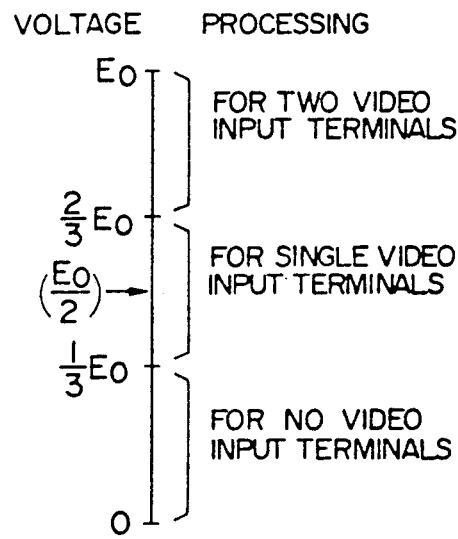

SWITCHING CONTROL APPARATUS FOR TUNING SYSTEM

This application is a continuation-in-part of application Ser. No. 07/500,209, filed Mar. 28, 1990 abandon.

BACKGROUND OF THE INVENTION

The present invention relates to tuning control systems used in television receivers including video tape recorders (VTRs) and AM FM radio receivers, and more particularly, to such apparatus which, in turn, includes an analog to digital converter.

Recently, a tuning control system with a controllable electronic tuner has its main portion made of multi-function ICs. The IC of one chip is used not only for control of tuning, but also for control of on and off operations of a power supply of a television receiver or for adjustment of acoustic volume. The multi-function IC which serves its central role is desired to be used in many kinds of apparatus in terms of productiveness and cost.

A conventional tuning control system will now be described with reference to the drawings. FIG. 1 is a block diagram of a tuner of a conventional television receiver. A reference numeral 1 denotes an automatic frequency regulator (AFT) of the television receiver. The AFT voltage signal corresponding to the output signal of the well-known AFT 1 is inputted to an analog to digital (A/D) converter 3 of a tuning control IC 13 to be converted into an AFT digital signal, which is then input to a central processing unit (CPU) 5 where the digital AFT signal is processed by control software stored in a read only memory (ROM) 6. The resulting data signal is outputted from an output port 7 connected to CPU 5 so as to correct the reception frequency of an electric tuner 9.

A DC power source voltage $E_0$ has series connected voltage dividing resistors 11 and 12 having resistance values $R_{11}$ and $R_{12}$, respectively. If $R_{11} = R_{12}$, a voltage signal of $E_0/2$ is applied to the A/D converter 4. The voltage levels set by the resistors 11 and 12 correspond to three operational modes, as shown in FIG. 3.

If a key switch 15 which selects one of television and video inputs is pressed so as to select a video mode, the input signal voltage to the input port 14 drops from $E_0$ (volts) to 0 (volts). The control software stored in the ROM 6 is programmed so as to be expressed by a flowchart shown in FIG. 2. As will be understood from the flowchart, when the input voltage level to the input port 14 becomes 0 volts, CPU 5 takes the data signal from the A/D converter 4. Applied to the input of the A/D converter 4 is a voltage signal of $E_0/2$ (volts) indicating that the number of video input terminals is 1 (unity). Therefore, a binary operational-mode selective signal (TV mode: H, and VTR mode: L corresponding to the initial set mode L) when the number of video input terminals is 1 (unity) is output to the output port 8 to thereby control the television/video input switching circuit 10. The operational mode signal is circulated in the order of a television mode→a video mode→the television mode. While the operation of the tuning control system having a single video input terminal has been described, the operation of a tuning control system having two video input terminals is as follows. The initial setting by the resistors 11 and 12 is made such that the set voltage is between $2E_0/3$ and $E_0$. Under such conditions, when the key switch 15 is pressed, processing is performed as in the initial setting mode mentioned above, and a mode selective signal which circulates the operational mode is outputted from the output port 8 in the order of television mode→video mode→television mode. In this way, the station selecting apparatus is able to set three kinds of initial modes: a non-video input terminal mode, a single-video input terminal mode, and a two video input terminal mode in accordance with voltage levels set by combinations of resistors 11 and 12. In addition, the apparatus is usable in three kinds of television receivers.

However, in the conventional device, at least two A/D converters are employed in the tuning control IC; namely, the A/D converter for reception of the AFT voltage signal and the A/D converter for reception of a mode setting voltage signal must be provided. The A/D converter occupies a relatively large area when it is designed so as to include IC circuits, so that only provision of many A/D converters would bring about a large-scale IC and increase the cost. There is a known multiplexing technique which realizes an apparatus using a single A/D converter. In this case, however, the number of IC pins is required to increase only for multiplexing control purposes.

SUMMARY OF THE INVENTION

It is an object of the present invention to provide a tuning control system which is usable in three kinds of television receivers operating in a no-video input terminal mode, a single-video input terminal mode and a two-video input terminal mode without increasing the number of A/D converters for tuning control purposes and without increasing the number of IC pins.

In order to achieve the above object, the tuning control system according to the present invention includes a switching circuit for selecting an input to the A/D converter in accordance with the on or off state of a power supply of a television receiver such that the A/D converter receives an AFT signal when the power supply is on, and second information on the number of video terminals when the power supply is off and such that the station selecting IC receives the AFT signal when the power supply is on, and second information when the power supply is off.

Therefore, according to the tuning control system of the invention, a single A/D converter suffices for the station selecting IC and hence the number of IC pins is reduced. Thus, the tuning control IC is reduced in scale and cost.

BRIEF DESCRIPTION OF THE DRAWINGS

FIGS. 2 and 3 are a flowchart of control software indicative of the operation of the central processing unit in the conventional tuning control system;

DESCRIPTION OF THE PREFERRED EMBODIMENTS

Figure 1:
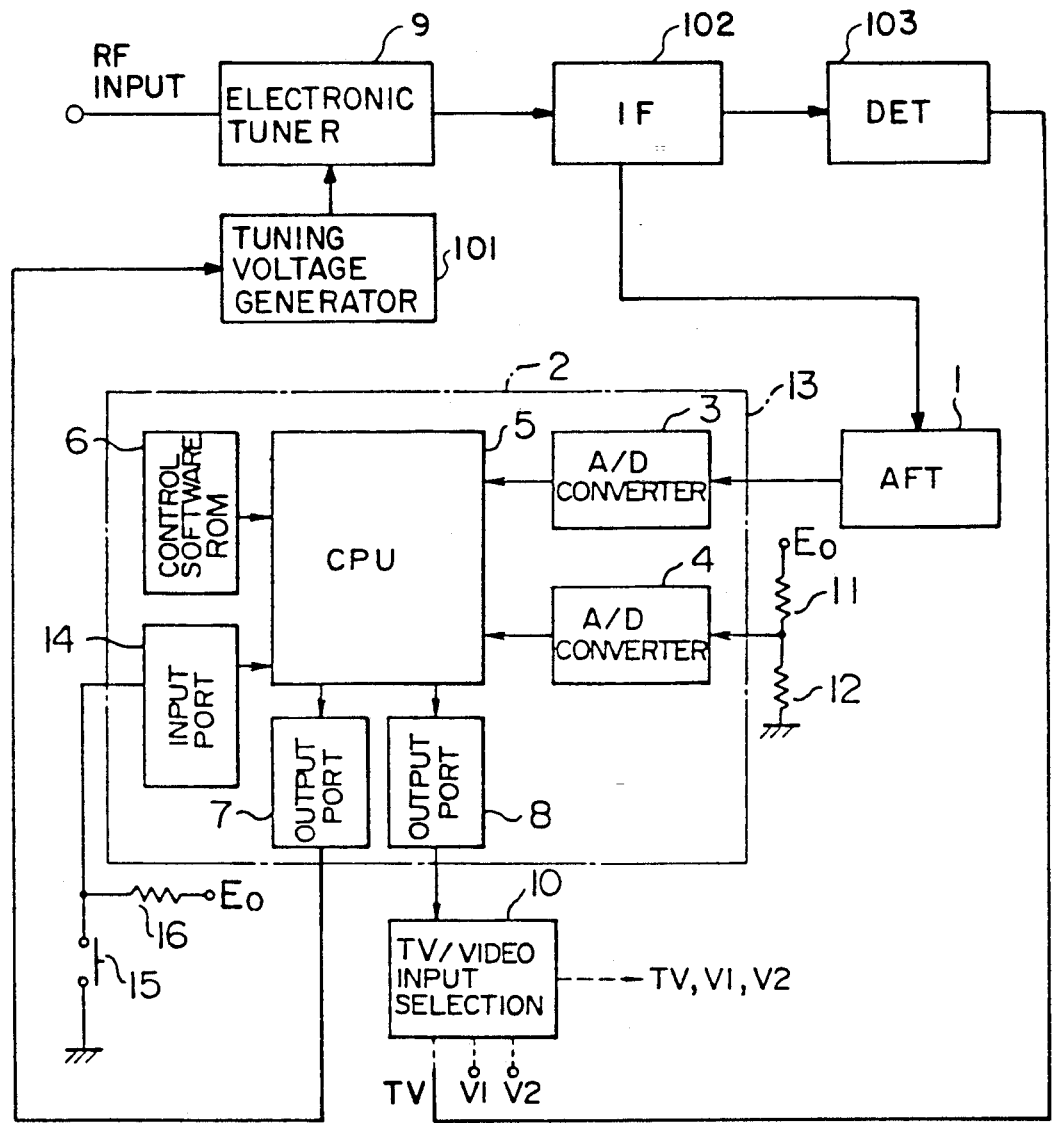
FIG. 1 is a block diagram of a conventional tuning control system.
Figure 4:
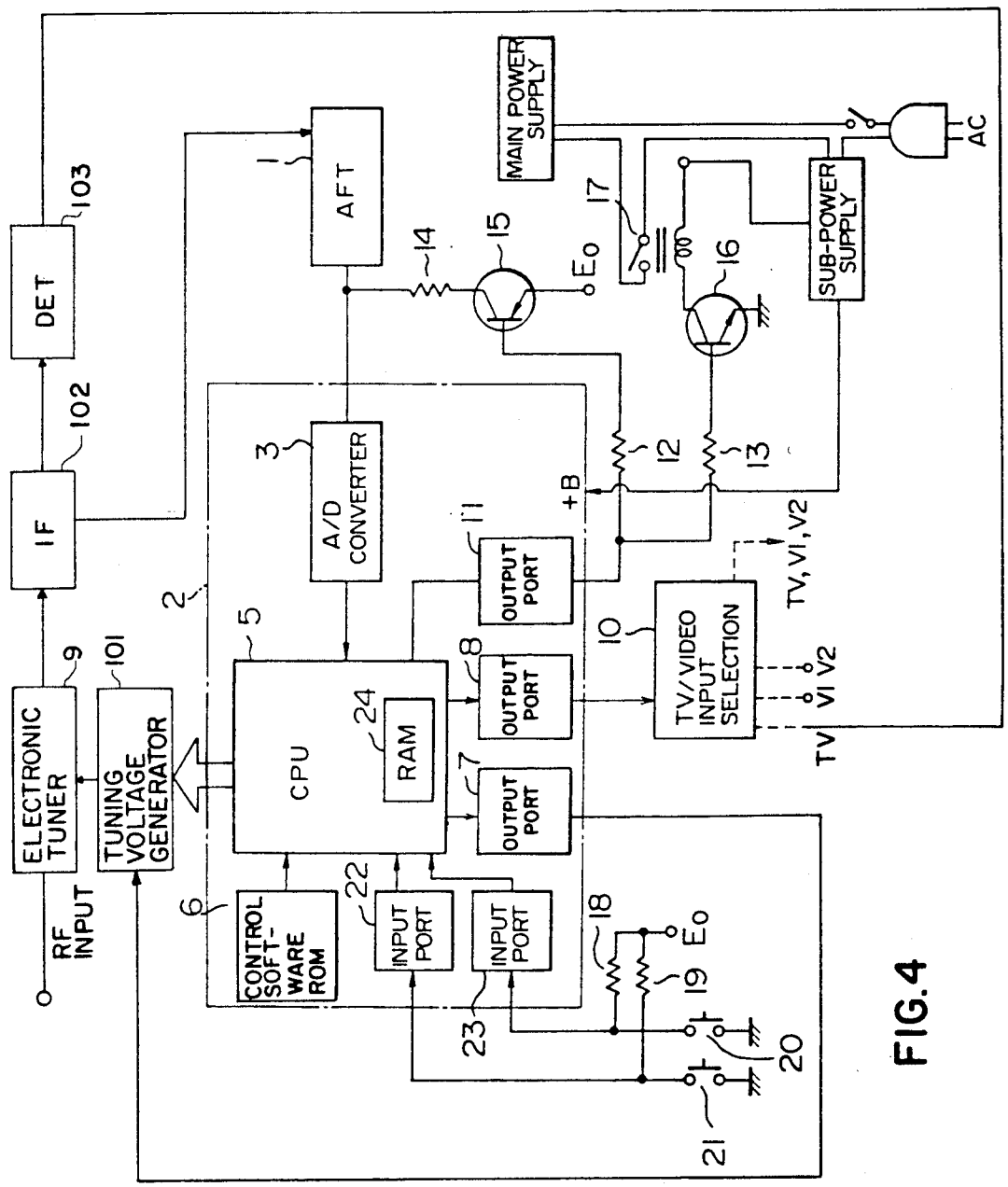
FIG. 4 is a block diagram of a tuning control system as one embodiment of the present invention.

One embodiment of the present invention will now be described with reference to the drawings. FIG. 4 is a block diagram of a tuning control system as one embodiment of the present invention. In FIG. 4, reference numeral 1 denotes an AFT of a television receiver whose output comprises an AFT voltage signal which is inputted to a central processing unit (CPU) 5 via an A/D converter 3. CPU 5 has a control software ROM 6 connected thereto. The control software stored therein operates the system which comprises CPU 5 as the hub. Reference numeral 20 denotes a key switch which turns on and off the main power supply of the television receiver; 21, a key switch for selecting between television and video inputs. Both the switches 20 and 21 are connected via input ports 23 and 22, respectively, to CPU 5. The key switch 21 is a push switch which generates a pulse signal when pressed. The control output signal from CPU 5 is supplied to an electronic tuner 9 via an output port 7, to a circuit 10, which selects between television and video inputs, via an output port 8 and to a transistor 16 which drives a power supply relay 17 via an output port 11 and a resistor 13. The output signal from the output port 11 is supplied to a transistor 15 which selects an input to the A/D converter 3 via a resistor 12.

CPU 5 delivers data corresponding to a channel to be selected to a tuning voltage generator 101. Tuning voltage generator 101 generates a tuning voltage corresponding to the data delivered thereto, and supplies the tuning voltage to an electronic tuner 9. Tuner 9 selects a channel corresponding to the tuning voltage, and supplies an output to an IF amplifier 102. The amplified signal is detected by a detector 103 and a video signal is taken out. The video signal is supplied to TV/VIDEO input selector 10 as a TV input.

On the other hand, a carrier component amplified by IF amplifier 102 is supplied to an AFT circuit 1, and an output voltage corresponding to a frequency deviation is generated. This output voltage is inputted to A/D converter 3 of tuning control IC 2.

The present invention thus includes a switching circuit which changes over two different kinds of input signals, i.e., first and second input signals, and one of the two input signals is supplied to a single A/D converter of a tuning control system. The switching circuit is controlled by ON and OFF states of a power supply to a receiver. The first input signal to the A/D converter can be an AFT (AFC) voltage, and AGC voltage, etc., representing a receiving state, and the second input signal can be a control signal which controls the tuning control system. The first input signal is inputted when the power supply to the receiver is turned ON, and the second input signal is inputted when the power supply to the receiver is turned OFF. Thus, two kinds of information can be supplied to a single A/D converter by changing over therebetween.

In operation, assume that the power main supply is off. The output signal from the output port 11 is rendered low on a control command from CPU 5 in the tuning control IC 2 in an operative state due to power supplied by a sub-power supply an on state. Therefore, the base current in the transistor 15 flows through the resistor 12 to thereby render transistor 15 conductive. At this time, the AFT 1 outputs no AFT voltage signal because the main power supply is off and a voltage of $E_0 \times Z_0/(R_{14}+Z_0)$ volts is inputted to the A/D converter 3 where $R_{14}$ is the resistance value of the resistor 14, and $Z_0$ is the impedance seen from the output terminal because the transistor 15 is on.

Figure 5:
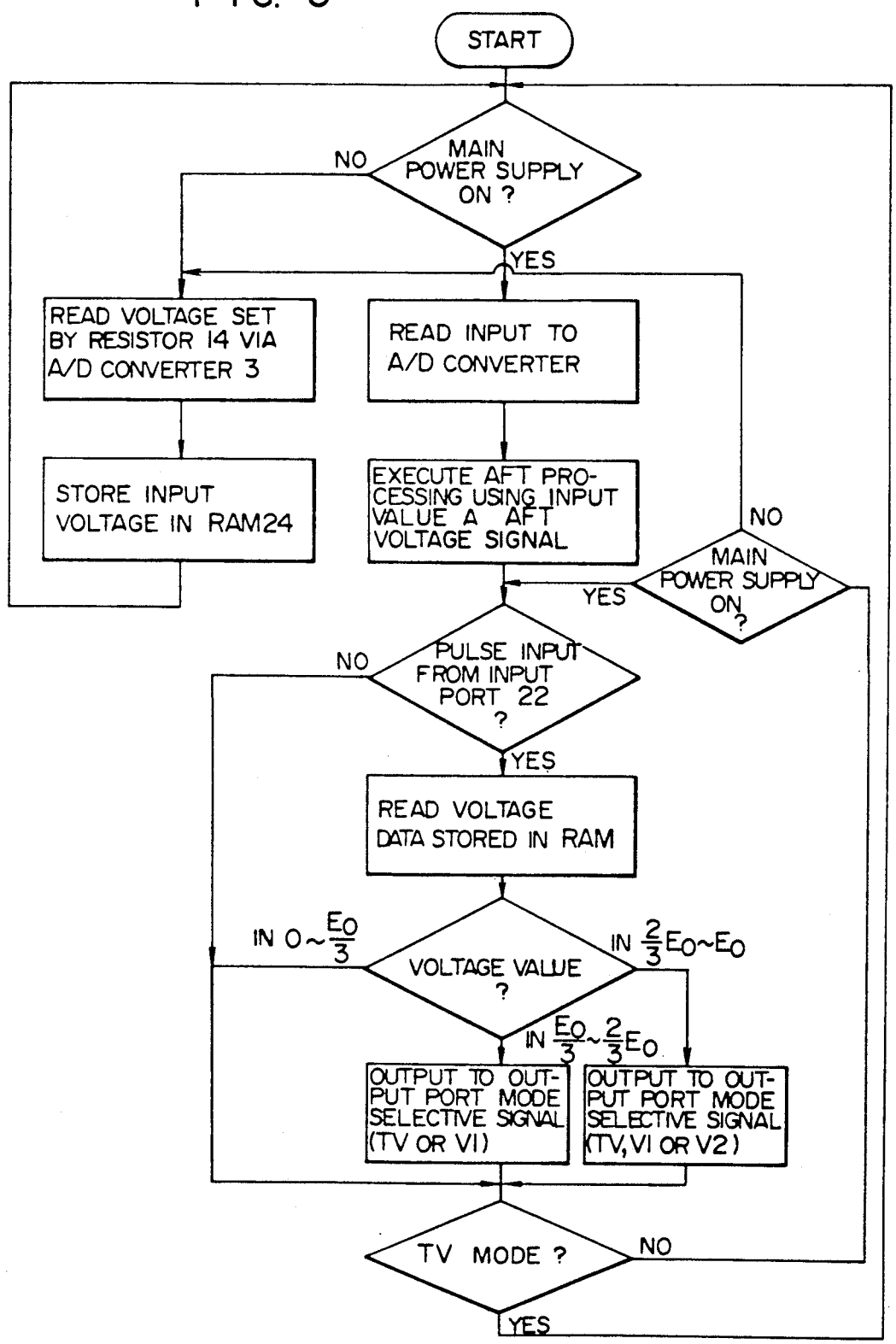
FIG. 5 is a flowchart of control software indicative of the operation of the central processing unit of FIG. 4.

Assume now that $Z_0 = R_{14}$, and the input voltage is $E_0/2$. As shown in the flowchart of FIG. 5, CPU 5 receives a data signal from the A/D converter 3 when the main power supply is off, and stores it in an internal RAM 24.

If the main power supply on-off key switch 20 is pressed, the signal level to the input port 23 changes high to low and CPU 5 changes the output from the output port 11 from low to high. As a result, a power supply relay 17 is turned on because the transistor 16 is rendered conductive, and the main power supply of the television receiver is turned on. Since the base of the transistor 15 is changed simultaneously to high via the resistor 12, so that the transistor 15 is turned off and the AFT voltage output signal from the AFT 1 as it is inputted to the A/D converter 3. Therefore, CPU 5 performs AFT processing using the input to the A/D converter as an AFT voltage signal, as shown in the flowchart of FIG. 5, to thereby correct the reception frequency in the electronic tuner 9.

Under such conditions, if the television-video input switching key 21 is pressed, the signal level to the input port 22 is changed from high to low for the time interval corresponding to the width of a pulse generated by the pressing of the key 21, and CPU 5 detects the reception of a trigger pulse signal thereto, reads a voltage value stored in RAM 24 when the main power supply is off, determines which of the ranges of $0 - E_0/3$, $E_0/3 - 2E_0/3$ and $2E_0/3 - E_0$ the read value is in, and outputs a mode selective signal to the output port 8 in accordance with the read voltage value.

In the present embodiment, data on the voltage $E_0/2$ generated across the resistor 14 when the main power supply is off and the sub-power supply is on is stored in RAM 24. Thus, CPU 5 outputs to the output port 8 a mode selective signal which requires to change the mode from the television input to the video input in accordance with the trigger pulse signal which is a signal requiring to switch between the television mode and the video mode, and the data on $E_0/2$ is read out of RAM 24. The mode selective signal is realized, for example, by a 2-bit binary signal. More specifically, the television mode is "01" while the video mode is "10". Assume herein that the "10" mode selective signal is input to the television/video switching circuit 10. As a result, the switching circuit 10 selects the input signal from the video tape recorder, etc., in place of the currently selected signal from the television receiver circuit, and supplies it to the subsequent signal processor (not shown).

The switching operation from the video mode to the television mode is performed as follows. If the television/video input switching key 21 is pressed when the main power supply is on and the operational mode is the video mode, a trigger pulse signal is generated in a manner similar to that mentioned above and input signal to the input port 22. In response to this pulse signal, CPU 5 reads the data on the voltage value corresponding to $E_0/2$ stored in RAM 24 and processes it in order to determine which of the television and VTR modes should be selected as the operational mode and which of the three initial settable modes the initial set mode is. As a result, the 2-bit code signal "01", requiring the operational mode to be the television mode, is outputted to the output port 8. Thus, CPU 5 reads an AFT signal from AFT 1 using a control signal and tunes the electronic tuner 9 so as to receive a desired signal.

As mentioned above, the initial setting and the selection of the operational modes (TV, VTR) of the television receiver having a single video input terminal are performed.

When the IC 2 is used in a television receiver having no video input terminals, $R_{14}$ is selected so as to be larger than $2Z_0$ on the basis of $E_0 \times Z_0/(R_{14}+Z_0) < E_0/3$.

If it is used in a television receiver having two video input terminals, $R_{14}$ is selected so as to be smaller than $Z_0/2$ on the basis of $E_0 \times Z_0/(R_{14}+Z_0) > 2E_0/3$.

As described above, in the tuning control system according to the present invention including an A/D converter, a switching circuit is provided for selecting one of a voltage signal indicative of the reception state and a second information signal indicative of the number of video terminals used for selecting between television and video inputs to the A/D converter in accordance with the on or off state of the main power supply. Namely, when the main power source is on, a voltage signal indicative of the reception state is inputted to the A/D converter while when the power source is off, the second information signal is input. Therefore, a single A/D converter suffices for the apparatus to thereby facilitate the formation of an apparatus of ICs.

While, in the particular embodiment described above, information on the AFT voltage and on the number of terminals for selecting between the television and video inputs is taken in, the AGC voltage and the voice multi-broadcasting mode may be used as the signal indicative of the reception state while whether the television receiver can receive voice multi-broadcasting or not and whether the receiver can receive satellite broadcasting or not may be used as the second information.

What is claimed is:

1. A switching control apparatus for a tuning system, comprising:

a station selecting unit including an analog to digital converter having input means for receiving selectively a first signal indicative of a reception state of a receiver and a second information signal independent of the first signal, said station selecting unit supplying output data for controlling a tuning voltage generator which generates a tuning voltage for a tuner;

a switching circuit for selecting one of said first signal and said second signal for inputting to said analog to digital converter in accordance with an on or off state of a power supply of the receiver; and a control circuit for controlling said switching circuit such that responsive to the power supply being on, said first signal is input to said analog to digital converter and responsive to the power supply being off, said second information signal is input to said analog to digital converter.

* * * * *